United States Patent
Sze

[11] Patent Number: 5,933,728
[45] Date of Patent: Aug. 3, 1999

[54] PROCESS FOR FABRICATING BOTTOM ELECTRODE OF CAPACITOR

[75] Inventor: Jhy-Jyi Sze, Tainan, Taiwan

[73] Assignee: United Semiconductor Corp., Hsinchu City, Taiwan

[21] Appl. No.: 09/054,838

[22] Filed: Apr. 3, 1998

[30] Foreign Application Priority Data

Dec. 12, 1997 [TW] Taiwan .................................. 86118764

[51] Int. Cl.$^6$ .............................................. H01L 21/8242
[52] U.S. Cl. ........................... 438/255; 438/398; 438/704; 438/712; 438/735; 438/761; 438/764; 438/792
[58] Field of Search .................................... 438/253, 254, 438/255, 396, 397, 398, 704, 712, 719, 735, 756, 759, 761, 764, 778, 788, 792; 257/306, 309

[56] References Cited

U.S. PATENT DOCUMENTS

| 5,723,373 | 3/1998 | Chang et al. | 438/253 |
| 5,766,995 | 6/1998 | Wu | 438/255 |
| 5,814,549 | 9/1998 | Wu | 438/398 |
| 5,866,455 | 2/1999 | Wu | 438/255 |

Primary Examiner—Robert Kunemund
Assistant Examiner—Donald L. Champagne
Attorney, Agent, or Firm—Christie, Parker & Hale, LLP

[57] ABSTRACT

A process for fabricating bottom electrodes for storage capacitors of memory cell units of a DRAM is disclosed. The process employs the use of a protective dielectric layer that serves as an etching shield in the process of fabrication of the capacitor electrode. The HSG-Si layer that substantially increases the surface area of the capacitor electrode can be protected from etching damage, thereby avoiding short-circuiting phenomena found in the conventional fabrication processes. Improved data retention time capability of the DRAM memory cells can thus be obtained utilizing the fabrication process of the invention.

11 Claims, 3 Drawing Sheets

PROCESS FOR FABRICATING BOTTOM ELECTRODE OF CAPACITOR

CROSS-REFERENCE TO RELATED APPLICATION

This application claims the priority benefit of Taiwan application serial no. 86118764, filed Dec. 12, 1997.

BACKGROUND OF THE INVENTION

1. Field of the Invention

This invention relates in general to the fabrication of semiconductor integrated circuits (ICs) and, in particular, to the fabrication of dynamic random-access memory (DRAM) IC devices. More particularly, this invention relates to the fabrication of the bottom electrode for the storage capacitor for DRAM IC devices.

2. Description of Related Art

DRAM devices rely substantially on the storage capacitor of the memory cell units for data storage. Inherent leakage characteristics of these storage capacitors requires that the capacitance be sufficiently large to sustain reasonable data retention time. Insufficient data retention time implies that the DRAM memory cells be refreshed at an excessively large duty cycle, which degrades the overall performance. However, as ULSI DRAM devices are being fabricated, utilizing more and more refined resolutions, die area assigned to each memory cell unit in the DRAM device has been decreasing. This directly reduces the available surface area that is allowed within the already limited spaces. Efforts have been devoted to increase the electrode surface area for these storage capacitors. Among the efforts, hemispherical-grain polysilicon (HSG-Si) layers have been formed over the surface of the capacitor bottom electrode in order to increase the effective electrode surface area.

FIGS. 1A–1D depict a conventional process for fabricating a bottom electrode for DRAM memory cell storage capacitors in a series of selected process stages. As is illustrated in FIG. 1A, field oxide layers 12 are first formed over the surface of the device substrate 10 used to fabricate cell units of the DRAM device. Surface of the substrate 10 is then covered with a layer of dielectric 14 having contact openings 16 formed therein. These openings 16 reveal the surface of the source/drain regions of the cell unit transistors embedded in the substrate; these are not detailed in the drawing.

Then, as is illustrated in FIG. 1B, an electrically conductive material is then deposited over the surface of the device substrate, covering the surface of the dielectric layer 14, and filling into the openings 16 formed therein. This deposited conductive layer of material is then patterned to form the conductor layer 18, as shown in the cross-sectional view. The material used to form the conductive layer 18 can be, for example, doped polysilicon formed, for example, in a low-pressure chemical vapor deposition (LPCVD) procedure.

With reference to FIG. 1C, it can be observed that an HSG-Si layer 20 is then formed over the surface of the entire substrate structure at this stage. This includes covering the surface of the conductive layer 18 and the surface of the dielectric layer 14 not covered by the conductive layer 18. To achieve this, the HSG-Si layer 20 may be formed, for example, in an LPCVD procedure utilizing $SiH_4$ or $Si_2H_6$ supplied by the reaction gaseous source. The deposition temperature is controlled to be in the range between the formation temperature for amorphous silicon and polysilicon. The HSG-Si layer 20 is formed directly by deposition.

Then, in FIG. 1D, an anisotropic etching procedure is performed to etch back the HSG-Si layer 20, so that the portions of the HSG-Si layer 20 covering the dielectric layer 14 can be removed. This prevents the undesirable short-circuiting between the consecutive capacitor electrodes formed on the device substrate. The deposited HSG-Si layer 20 is integrated with the conductive layer 18 to form the bottom electrode for the DRAM memory cell storage capacitor.

Such prior-art fabrication procedures employing direct etching against the HSG-Si layer 20, though capable of removal of the HSG-Si layer formed over the surface of the dielectric layer 14, also damage the HSG-Si layer 20 itself. In particular, the portion of the HSG-Si layer 20 covering the conductive layer 18 is most vulnerable to the etching. On excessive occasions, the HSG-Si layer 20 and the conductive layer 18 embedded beneath are damaged to a level that current leakage occurs through the dielectric layer 14. Thus, the etching procedure has to be controlled to avoid excessive damages to the HSG-Si layer.

Further, if the etching-back procedure is not properly controlled, micro-bridging phenomena will arise between bottom electrodes for the cell units. As a result, the capacitor structure for the cell units may eventually be damaged.

SUMMARY OF THE INVENTION

It is therefore an object of the invention to provide a process for fabricating a bottom electrode of the storage capacitor of memory cell units in the DRAM devices that provides increased HSG-Si electrode surface area without incurring excessive etching damages in the fabricational processing procedures.

The present invention achieves the objects identified above by providing a process for fabricating bottom electrodes for storage capacitors of memory cell units of a DRAM device in which the process includes first forming a first dielectric layer covering the surface of the device substrate. A silicon nitride layer is then formed covering the first dielectric layer. The silicon nitride layer is then patterned in a photolithographic procedure to form contact openings that reveal the surface of the substrate. An electrically conductive layer then covers the silicon nitride layer and also fills into the contact opening, thereby contacting the exposed source/drain regions of the cell unit transistor. A first HSG-Si layer then covers the conductive layer, followed by the formation of a second dielectric layer that covers the first HSG-Si layer. A photolithographic procedure then patterns and etches into the second dielectric layer, the first HSG-Si layer and the conductive layer, thereby exposing the surface of the silicon nitride layer. A second HSG-Si layer then covers the exposed surfaces of the conductive layer, the second dielectric layer and the silicon nitride layer. The second HSG-Si layer covering the surface of the silicon nitride layer and the second dielectric layer is then removed, thereby exposing the surfaces of the silicon nitride layer and the second dielectric layer. The second dielectric layer is then removed to expose the surface of the first HSG-Si layer, wherein the first HSG-Si layer is utilized as the bottom electrode for the storage capacitor.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DESCRIPTION OF THE PREFERRED EMBODIMENT

Figure 1A:
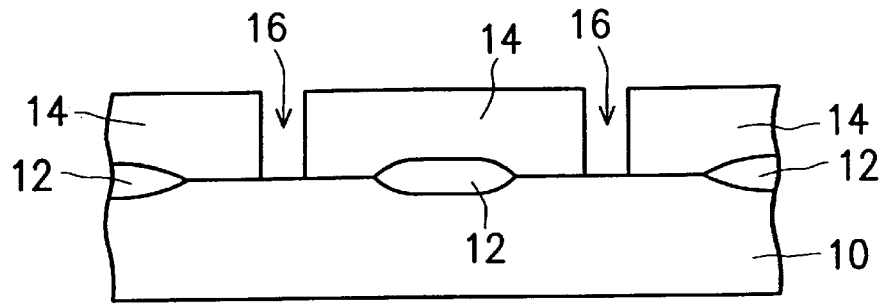
FIGS. 1A, 1B, 1C and 1D depict a conventional process for fabricating bottom electrode for DRAM memory cell storage capacitors in a series of selected process stages.
Figure 1B:
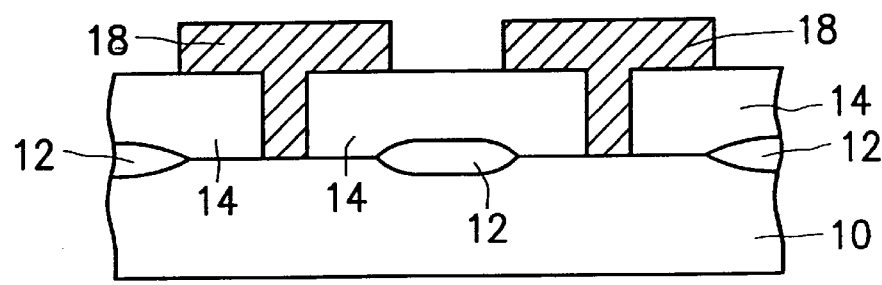
Figure 1C:
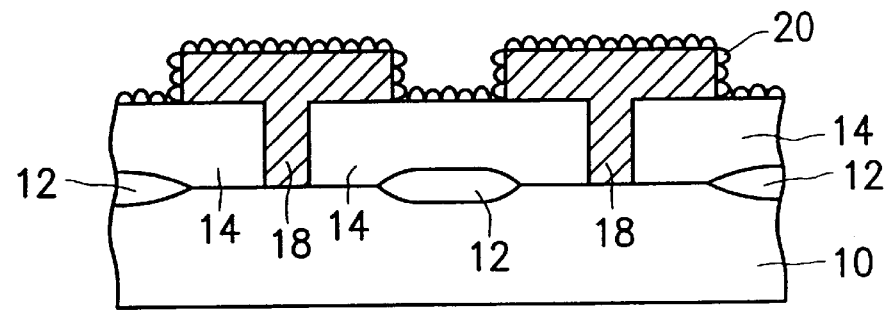
Figure 1D:
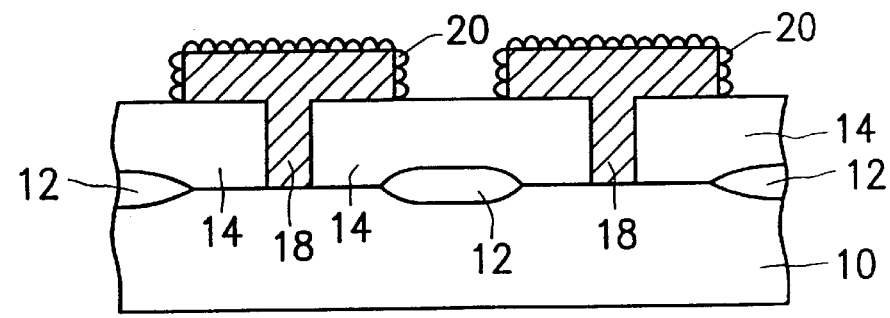
Figure 2A:
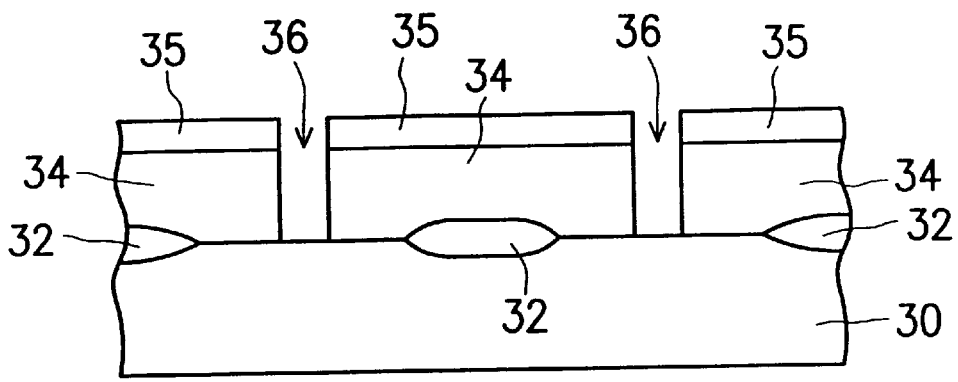
FIGS. 2A, 2B, 2C, 2D and 2E depict a process for fabricating bottom electrodes for DRAM memory cell storage capacitors in a series of selected process stage in accordance with a preferred embodiment of the invention.

FIGS. 2A–2E are respectively cross-sectional views depicting a process for fabricating bottom electrodes for DRAM memory cell storage capacitors in a series of selected process stage in accordance with a preferred embodiment of the invention. First, as is illustrated in FIG. 2A, field oxide layers 32 are formed over the surface of the device substrate 30 used as the basis for the fabrication of the DRAM device. The surface of the substrate 30 is then covered with a dielectric layer 34, which may be a silicon oxide layer, followed by the subsequent formation of a silicon nitride layer 35. The silicon nitride layer 35 and the dielectric layer 34 are then patterned in, for example, a photolithographic procedure in order to have contact openings 36 formed therein, as is illustrated in the drawing. These openings 36 reveal the surface of the source/drain regions of the cell unit transistors embedded in the substrate; these are not detailed in the drawing.

Figure 2B:
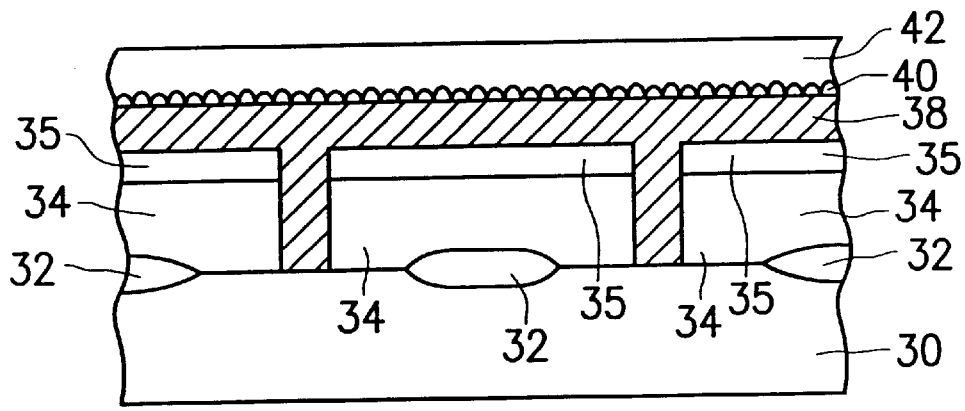

Then, as is illustrated in FIG. 2B, an electrically conductive material is then deposited over the surface of the device substrate, covering the surface of the silicon nitride layer 35, as well as filling the openings 36 formed therein. The deposited conductive layer 38 contacts the source/drain regions of the cell unit transistor electrically. The material used for the conductive layer 38 can be, for example, doped polysilicon that is formed, for example, in an LPCVD procedure.

Then, an HSG-Si layer 40 is formed over the surface of the entire substrate structure at this stage. This covers the surface of the conductive layer 38. To achieve this, the HSG-Si layer 40 may be formed, for example, in an LPCVD procedure utilizing $SiH_4$ or $Si_2H_6$ supplied by a reaction gaseous source. The deposition temperature is controlled to be in the range between the formation temperature for amorphous silicon and polysilicon. The HSG-Si layer 40 is formed directly by deposition. After the formation of the HSG-Si layer 40, a covering dielectric layer 42 of, for example, borophosilicate glass (BPSG) can be formed in, for example, a CVD procedure. This dielectric BPSG layer 42 covers the entire surface of the HSG-Si layer 40 formed in the previous fabricational step.

Figure 2C:
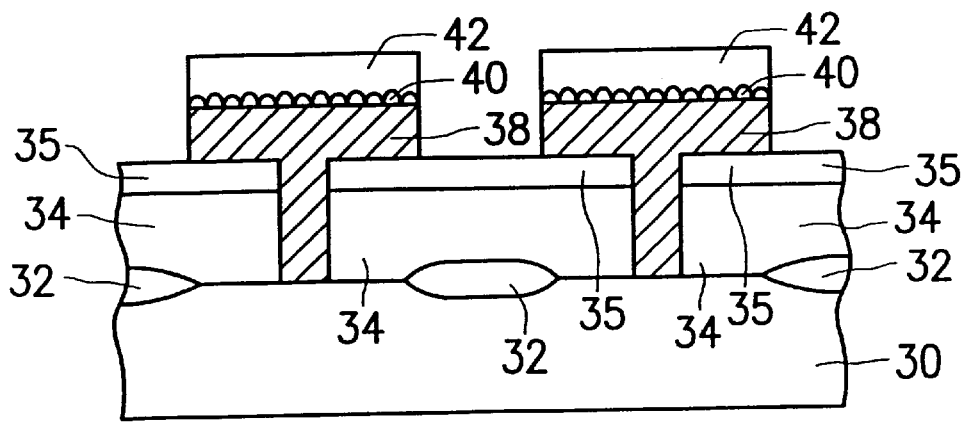

With reference to FIG. 2C, a photolithographic and etching procedure is employed to pattern the stack of the covering dielectric layer 42, the HSG-Si layer 40 and the conductive layer 38. This can be done by implementing an etching procedure based on the presence of the patterned photoresist layer. The etching procedure concludes when the surface of the silicon nitride layer 35 is exposed. This achieves the structural configuration shown in FIG. 2C, with a residue of the covering dielectric layer 42 remaining to cover the surface of the HSG-Si layer 40.

Figure 2D:
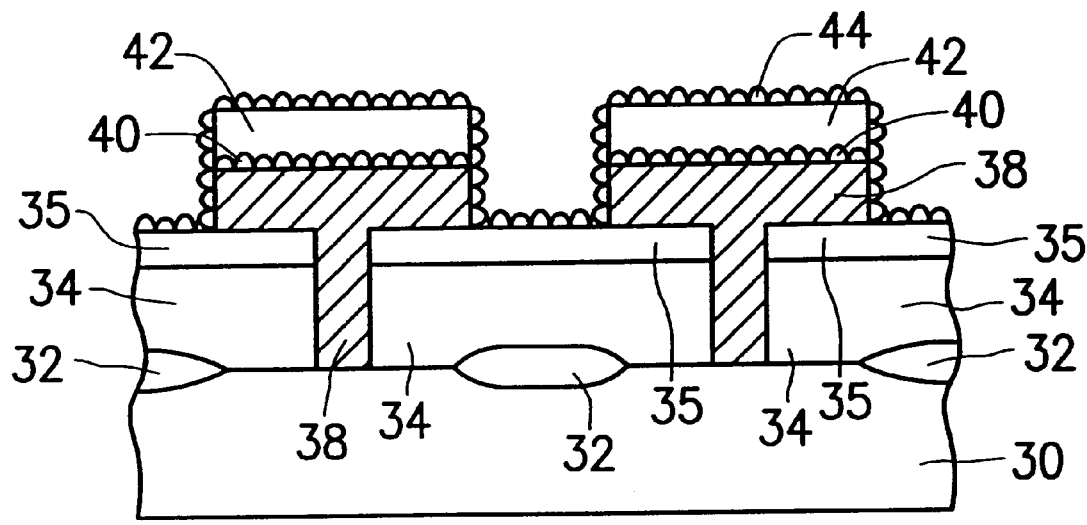

Then, as is illustrated in FIG. 2D, a procedure similar to the one used to form the HSG-Si layer 40 in the previous procedural step is employed to form another HSG-Si layer 44 that covers the surface of the entire device substrate, including the surface of the covering dielectric layer 42, and the exposed surface of the silicon nitride layer 35. Sidewalls of the covering dielectric layer 42 and the conductive layer 38 are also covered by the formed HSG-Si layer. Again, this second HSG-Si layer 44 can be formed, for example, in an LPCVD procedure utilizing $SiH_4$ or $Si_2H_6$ as the reaction gaseous source. The deposition temperature may be controlled to be in the range between the formation temperature for amorphous silicon and polysilicon. The HSG-Si layer 44 is formed directly by deposition.

Figure 2E:
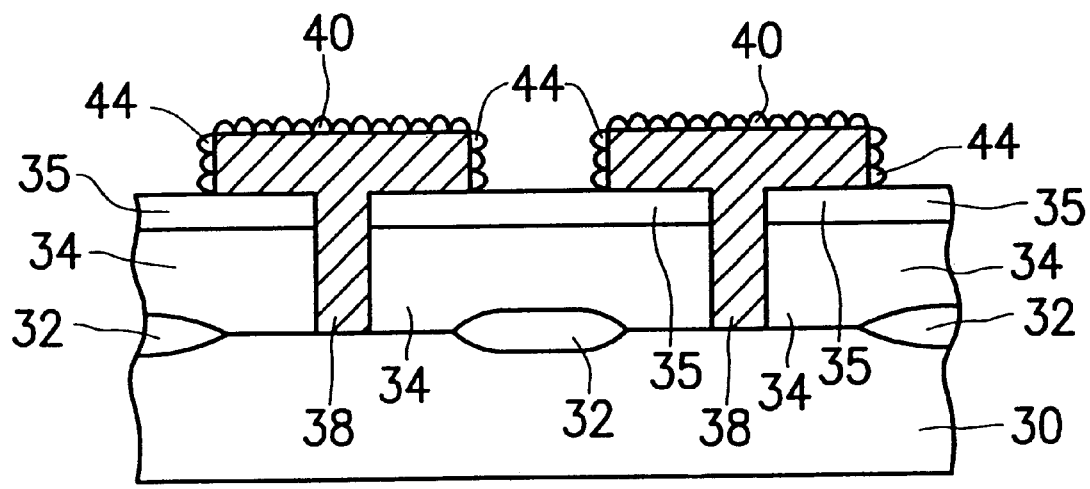

Next, referring to FIG. 2E, an anisotropic etching procedure is then employed to etch back into the device substrate. The etching back procedure subsequently removes the HSG-Si layer 44 that covers the surface of the silicon nitride layer 35 and the dielectric layer 42, which essentially exposes the surface of the silicon nitride layer 35. Afterwards, another etching procedure, for example, a reactive ion etching (RIE) procedure employing the gaseous HF etchant or HF solution may then be implemented to remove the covering dielectric layer 42 until the surface of the first HSG-Si layer 40 is exposed. This removal of the covering dielectric layer 42 avoids the formation of short-circuiting between the conductive layers 38 for the cell units of the memory device. In this case, the conductive layer 38, the first HSG-Si layer 40 and the second HSG-Si layer 44, together, can be utilized as the bottom electrode for the memory cell storage capacitor for the fabricated DRAM device.

In the process of fabricating the bottom electrode for the storage capacitor of DRAM device memory cell units, the fabrication process of the invention employs the use of a covering dielectric layer 42 as a shielding mask. This protective shielding mask can be used to prevent damages to the HSG-Si layer when a necessary etching-back procedure is performed. The HSG-Si layer that constitutes the surface layer of the bottom electrode of the storage capacitor is critical to the improvement, namely, increase of the storage capacitor capacitance. The presence of the covering dielectric layer 42 is helpful in preventing the formation of short-circuiting between the conductive layers among consecutive memory cell units.

While the invention has been described by way of example and in terms of preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A process for fabricating bottom electrodes for storage capacitors of memory cell units of a dynamic random-access memory device, the process comprising the steps of:

providing a semiconductor substrate;

forming a first dielectric layer covering the surface of the substrate;

forming a silicon nitride layer covering the first dielectric layer;

patterning and etching the silicon nitride layer in a photolithographic procedure to form contact openings revealing the surface of the substrate;

forming an electrically conductive layer covering the silicon nitride layer and filling into the contact opening thereby contacting the exposed regions of the substrate in the openings;

forming a first hemispherical-grain polysilicon layer covering the conductive layer;

forming a second dielectric layer covering the first hemispherical-grain polysilicon layer;

patterning and etching in a photolithographic procedure to etch into the second dielectric layer, the first hemispherical-grain polysilicon layer and the conductive layer, thereby exposing the surface of the silicon nitride layer;

forming a second hemispherical-grain polysilicon layer covering the exposed surface of the conductive layer, the second dielectric layer and the silicon nitride layer;

removing the second hemispherical-grain polysilicon layer covering the surface of the silicon nitride layer and the second dielectric layer, thereby exposing the surface of the silicon nitride layer and the second dielectric layer; and removing the second dielectric layer thereby exposing the surface of the first hemispherical-grain polysilicon layer, wherein the first hemispherical-grain polysilicon layer is utilized as the bottom electrode for the storage capacitor.

2. The process for fabricating bottom electrodes of claim 1, wherein the conductive layer is formed in a low-pressure chemical vapor deposition procedure.

3. The process for fabricating bottom electrodes of claim 1, wherein the first hemispherical-grain polysilicon layer is formed in a low-pressure chemical vapor deposition procedure.

4. The process for fabricating bottom electrodes of claim 1, wherein the second hemispherical-grain polysilicon layer is formed in a low-pressure chemical vapor deposition procedure.

5. The process for fabricating bottom electrodes of claim 1, wherein the step of removing the silicon nitride layer and the second dielectric layer is an anisotropic etching procedure.

6. The process for fabricating bottom electrodes of claim 1, wherein the second dielectric layer is removed in a reactive ion etching procedure.

7. The process for fabricating bottom electrodes of claim 1, wherein the second dielectric layer is removed in a reactive ion etching procedure employing a gaseous HF etchant.

8. The process for fabricating bottom electrodes of claim 1, wherein the second dielectric layer is removed in a reactive ion etching procedure employing an HF solution.

9. The process for fabricating bottom electrodes of claim 1, wherein the electrically conductive layer is a doped polysilicon layer.

10. The process for fabricating bottom electrodes of claim 1, wherein the first dielectric layer is a silicon oxide layer.

11. The process for fabricating bottom electrodes of claim 1, wherein the second dielectric layer is a borophosilicate glass layer.

* * * * *